United States Patent [19]

Emesh et al.

[11] Patent Number: 5,728,603
[45] Date of Patent: Mar. 17, 1998

[54] METHOD OF FORMING A CRYSTALLINE FERROELECTRIC DIELECTRIC MATERIAL FOR AN INTEGRATED CIRCUIT

[75] Inventors: Ismail T. Emesh, Cumberland; David R. McDonald, Ottawa; Vsanta Chivukula, Nepean, all of Canada

[73] Assignee: Northern Telecom Limited, Montreal, Canada

[21] Appl. No.: 762,631

[22] Filed: Dec. 9, 1996

Related U.S. Application Data

[63] Continuation of Ser. No. 348,848, Nov. 28, 1994, abandoned.

[51] Int. Cl.$^6$ .................................................. H01L 21/02
[52] U.S. Cl. ........................... 437/235; 437/919; 437/225
[58] Field of Search ................................. 437/235, 225, 437/243, 919, 247

[56] References Cited

U.S. PATENT DOCUMENTS

| | | | |
|---|---|---|---|
| 4,963,390 | 10/1990 | Lipeles et al. | 427/110 |
| 5,043,049 | 8/1991 | Takenaka | 204/192.15 |
| 5,116,643 | 5/1992 | Miller et al. | 437/231 |
| 5,164,808 | 11/1992 | Evans, Jr. et al. | 361/305 |
| 5,191,510 | 3/1993 | Huffman | 257/295 |
| 5,258,093 | 11/1993 | Maniar | 437/60 |
| 5,271,955 | 12/1993 | Maniar | 437/231 |
| 5,350,705 | 9/1994 | Brassington et al. | 437/919 |
| 5,358,889 | 10/1994 | Emesh et al. | 437/919 |
| 5,374,578 | 12/1994 | Patel et al. | 437/47 |
| 5,443,688 | 8/1995 | Toure et al. | 437/919 |

FOREIGN PATENT DOCUMENTS

| | | |
|---|---|---|
| 0489519 A2 | 6/1992 | European Pat. Off. |
| 0557937 A1 | 2/1993 | European Pat. Off. |
| 0043241 | 2/1993 | Japan . |
| 0221643 | 8/1993 | Japan . |
| 0251351 | 9/1993 | Japan . |

OTHER PUBLICATIONS

Journal of Applied Physics, 1 Sep. 1994, USA, vol. 76, No. 5, ISSN 0021-8979, pp. 2711-2718, Simpson T W et al "Hydrogen catalyzed crystallization of strontium titanate".

B.A. Tuttle, et al Mat. Res. Soc. Symp. Proc vol. 200 (1990) pp. 159-169 "Charactrization of Chemically Prepared PZT Thin Film".

S. Merklein, et al Mat. Res. Symp. Proc. vol. 310, 1993, pp. 263-268 "Crystallization Behavior and Electrical Properties of Wet-Chemically Deposited Lead Zirconate Titanate Thin Films".

J.S. Wright, et al "Phase development in Si modified sol-gel-derived lead titanate" J. Mater. Res. vol. 8, No. 7, Jul. 1993 pp. 1712-1720.

V. Joshi, et al "The influence of water of hydrolysis on microstructural development in sol-gel-derived LiNbO3 thin films" J. Mater, Res., vol. 8, No. 10, Oct. 1993 pp. 2668-2678.

M. Shimizu, et al "Preparation of PZT Thin Films by Mocvd Using a New Pb Precursor" 6th International Symposium on Integrated Ferroelectrics mar. 1994 p. 22c.

"Encyclopedia of Chemical Technology" ed. R. Kirk, D. Othmer vol. 9, p. 735 (re:02/03 explosion hazard).

*Primary Examiner*—Trung Dang
*Attorney, Agent, or Firm*—Angela C. de Wilton

[57] ABSTRACT

A method is provided for forming a crystalline perovskite phase of a ferroelectric dielectric material by a process of depositing a layer of amorphous ferroelectric precursor material and then annealing in an oxygen containing atmosphere in the presence of water vapor, preferably with the addition of a few percent of ozone and at a temperature of less than 500° C. Advantageously, the method provides for formation of a ferroelectric material comprising lead zirconate titanate, with low film stress, high dielectric constant and low leakage current. The reduced thermal budget allows for increase flexibility in integration of ferroelectric materials, e.g. after a step of deposition of low melting point metal or metal alloy.

12 Claims, 2 Drawing Sheets

METHOD OF FORMING A CRYSTALLINE FERROELECTRIC DIELECTRIC MATERIAL FOR AN INTEGRATED CIRCUIT

This application is a continuation of application Ser. No. 08/348,848, filed Nov. 28, 1994, abandoned.

FIELD OF THE INVENTION

This invention relates to a method of forming a crystalline ferroelectric dielectric material for an integrated circuit structure, with particular application to ferroelectric capacitors and memory cells.

BACKGROUND OF THE INVENTION

During the last few years, the use of the ferroelectric materials for random access memory (RAM) elements has reached commercial applications in the semiconductor industry. Ferroelectric memory elements are non-volatile, and programmable with low voltage, e.g. less than 5V. Other advantages include fast access times (<40 ns), and robustness with respect to virtually unlimited numbers of read and write cycles. These memory elements also consume low power, are dense and exhibit radiation hardness.

Ferroelectric materials which have allowed this breakthrough in integrated circuit applications include perovskite structure ferroelectric dielectric compounds, for example, lead zirconate titanate $PbZr_xTi_{1-x}O_3$ (PZT), barium titanate (BT), and barium strontium titanate (BST).

Among the known techniques for depositing ferroelectric thin films are RF sputtering, electron beam evaporation, chemical vapour deposition and gas jet deposition. In recent years, chemical methods of depositing PZT and other ferroelectric films have become popular, for example a metallorganic decomposition (MOD) and sol-gel deposition. A sol-gel process provides for ease of preparation and fabrication, i.e. by a spin-on liquid process, at lower capital cost compared with low pressure vacuum techniques. Nevertheless, a sol-gel method can produce ferroelectric dielectric materials of high quality.

Several challenges and concerns have to be addressed in the integration of ferroelectric materials with monolithic integrated circuits. These challenges include the selection of suitable materials for bottom and top electrodes, and for barrier layers and capping layers, to avoid or control contamination problems. Because ferroelectric materials contain chemical elements not typically found in conventional integrated circuit materials, interdiffusion of elements of the ferroelectric material and surrounding materials may occur, causing contamination and degradation of electrical characteristics.

In known methods of forming ferroelectric materials, a layer of a precursor comprising constituents of a ferroelectric material (e.g. a mixture of metal alkoxides) is deposited in an amorphous form, for example by a known sol-gel process. A post-deposition annealing is carried out to allow for a phase transformation of the amorphous, as-deposited layer into a crystalline phase, i.e. a perovskite ferroelectric dielectric phase, which has the required ferroelectric dielectric characteristics. Typically ferroelectric materials require heating to an annealing temperature in excess of 650° C., and preferably 700° C., for extended periods, in order to produce the required phase change to the perovskite phase which has the characteristic ferroelectric properties (see for example an article by S. Merklein et al., Mat. Res. Symp. Proc. vol. 310, 1993, p 263–268 entitled "Crystallization behavior and electrical properties of wet-chemically deposited lead zirconate titanate thin films". Thus, there has been interest in reducing the anneal temperature to be more compatible with IC processing with a reduced thermal budget. However, an intermediate metastable pyrochlore phase exists, which is not ferroelectric, and processing at insufficiently high temperature may result in a mixture of pyrochlore and perovskite (see for example J. S. Wright et al, "Phase development in Si modified sol gel derived lead-titanate", J. Mater. Res. Vol. 8, no.7, July 1993). An article by B. A. Tuttle et al, Mat. Res. Soc. Symp. Proc Vol. 200 (1990) page 159–169, entitled "Characterization of chemically prepared PZT thin films" reports that crystallization of the amorphous precursor to the perovskite phase at lower temperatures by rapid thermal processing at 525° C. when lower water additions were made to the starting solutions, but noted enhanced formation of perovskite PZT at 700° C., by heating rapidly through the temperature region 370° C.–600° C. at which the pyrochlore phase was observed to stable.

The relatively high crystallization temperature in known processes to obtain perovskite phase materials limits the application of ferroelectric materials in integrated circuits. Back-end processing of integrated circuits (i.e. steps such as formation of interconnect and contact metallization) typically require a relatively low thermal budget. If, for example, the interconnect metallization comprises an Al alloy (melting point ~600° C.) or other material which cannot tolerate a high temperature and/or extended time at elevated temperature, all higher temperature process steps, including deposition and annealing of the ferroelectric layers must be completed before forming the metallization.

Ferroelectric capacitors may be formed on a field oxide layer, in a similar manner as conventional polysilicon capacitors. However, the proximity of a PZT layer to an active device increases the risk of contamination by out-diffusion of elements from the PZT layer into the device well region. Selection of appropriate barrier layers to prevent diffusion is essential.

Another problem which arises is that ferroelectric films may be highly stressed. High stress may cause poor adhesion to the substrate, which results in peeling, and stress is also associated with fatigue. The tensile stress may be sufficient to cause marked bowing of the substrate wafers, so that difficulties arise with handling wafers during subsequent processing steps, particularly during lithography.

Furthermore, placing a ferroelectric capacitor below several layers of interconnects and dielectrics may induce stress, which also causes stress related fatigue of the ferroelectric material. It has also been found that exposure to the diffused hydrogen commonly used in the subsequent deposition steps and sintering, i.e. to form interconnect materials, can chemically reduce a PZT film and cause premature fatigue.

In forming a ferroelectric capacitor structure, the bottom electrode is typically made of a metal such as platinum, which has resistance to oxidation during the ferroelectric anneal process at high temperature, 650° C. Titanium may be used under the Pt layer as an adhesion layer for Pt. However, during annealing at 650° C., it is known that Ti from the adhesion layer, and Pb from PZT, may diffuse into the Pt layer. The loss of Pb from the ferroelectric creates vacancies in the PZT film which accelerate the fatigue (i.e. reduce endurance) of the PZT film thus limiting its application for high density non-volatile memory. The diffusion of various elements into the PZT film may cause an increase in the leakage current.

U.S. Pat. No. 5,043,049 to Takenaka discusses the formation of ferroelectric thin films with the addition of excess lead by ion implantation before annealing, or addition of $O_3$ and/or gaseous forms of lead to the annealing atmosphere to reduce out diffusion during annealing at temperatures in the range of 500°–900° C.

Consequently, a number of problems occur with integration of PZT and other ferroelectric materials into conventional process flows, many of these problems being related to the relatively high temperature which is required for processing deposited ferroelectric layers to form a crystalline phase of the ferroelectric dielectric material having the required electrical characteristics.

SUMMARY OF THE INVENTION

Thus, the present invention seeks to provide a method of forming a ferroelectric dielectric material for an integrated circuit which avoids or reduces the above mentioned problems, with particular application to formation of ferroelectric capacitors and memory cells.

According to one aspect of the present invention, there is provided a method of forming a crystalline perovskite ferroelectric dielectric material comprising: depositing a layer of amorphous ferroelectric precursor material on an integrated circuit substrate, and then annealing the layer of amorphous ferroelectric precursor material at a temperature sufficient to cause a phase transformation to a ferroelectric crystalline perovskite phase, the annealing step comprising heating in an oxygen containing atmosphere in the presence of water vapour.

Thus, after deposition of a layer of a ferroelectric material from a suitable precursor, e.g. an amorphous layer formed from a sol-gel mixture of the appropriate chemical constituents, annealing is carried out in an oxidizing ambient in the presence of water vapour.

Advantageously, wet annealing provided ferroelectric material which exhibited reduced tensile stress and improved leakage current relative to ferroelectric layers formed in a dry atmosphere.

Preferably, the annealing step is carried out by rapid thermal annealing in the presence of oxygen and water vapour at a temperature below 500° C., to provide a process compatible with integrated circuit processing which includes low melting point metal alloys and/or other heat sensitive substrate materials. Ferroelectric materials with acceptable electrical characteristics were obtained at anneal temperatures between 450° C. and 500° C.

The addition of a few percent ozone to the annealing atmosphere is beneficial in speeding up the oxidation and crystallization process, and significantly reduces the anneal time required to achieve crystallization at lower temperatures.

The electrical properties of PZT annealed below 500° C. in the presence of water vapour, oxygen and ozone were comparable with those ferroelectric perovskite dielectric materials by annealing in dry oxygen at much higher temperatures. Furthermore, it was found that samples annealed in wet ozone/oxygen mixtures at below 500° C. showed significantly reduced stress relative to samples annealed by a conventional process in dry oxygen.

Indeed, annealing in oxygen in the presence of both ozone and water vapour produced ferroelectric films with superior ferroelectric properties compared to films annealed in oxygen in the presence of either one of ozone and water.

Furthermore, when the ferroelectric dielectric for a capacitor structure is patterned by ion milling or reactive ion etching, post-processing annealing in oxygen, or preferably in wet oxygen and ozone is found to be beneficial in significantly reducing leakage currents.

Thus a method is provided for forming ferroelectric dielectrics for integrated circuits. A method is provided having a reduced thermal budget, i.e. low temperature anneal (450°–500° C.) and relatively short anneal times (e.g. several minutes) compared with known prior art methods, while providing ferroelectric characteristics comparable with known anneal processes at much higher temperatures. Thus this method very significantly increases the flexibility in placement of ferroelectric materials in an integrated circuit process. For example, a ferroelectric layer may be provided after formation of conductive interconnect and contact metallization using relatively low melting alloys, including aluminum alloys.

According to another aspect of the present invention there is provided a method of forming an integrated circuit structure comprising a ferroelectric capacitor structure the method comprising: providing a substrate and providing thereon a first capacitor electrode; providing on the electrode a layer of crystalline perovskite ferroelectric capacitor dielectric material, by steps comprising: depositing a layer of amorphous ferroelectric precursor material, and annealing the layer of amorphous ferroelectric precursor material at a temperature sufficient to cause a phase transformation to a ferroelectric crystalline perovskite phase, the annealing step comprising heating in an oxygen containing atmosphere in the presence of water vapour and providing a second capacitor electrode thereon.

When processing is carried out below 500° C., a ferroelectric capacitor may be placed above low melting point alloys, e.g., aluminum interconnect, in an integrated circuit, a structure which would not be possible using a conventional ferroelectric anneal process at above 650° C., i.e. above the melting point of aluminum alloys. Beneficially annealing of the first electrode in oxygen before deposition of a ferroelectric dielectric, and post patterning annealing of the ferroelectric dielectric also improve electrical characteristics of the resulting structures.

Thus the present invention provides a method of forming a ferroelectric dielectric material and a method of forming a ferroelectric capacitor for an integrated circuit structure which overcome or reduce some of the above mentioned problems.

BRIEF DESCRIPTION OF THE DRAWINGS

Embodiments of the invention will now be described by way of example, with reference to the accompanying drawing, in which.

DESCRIPTION OF THE PREFERRED EMBODIMENTS

Figure 1:
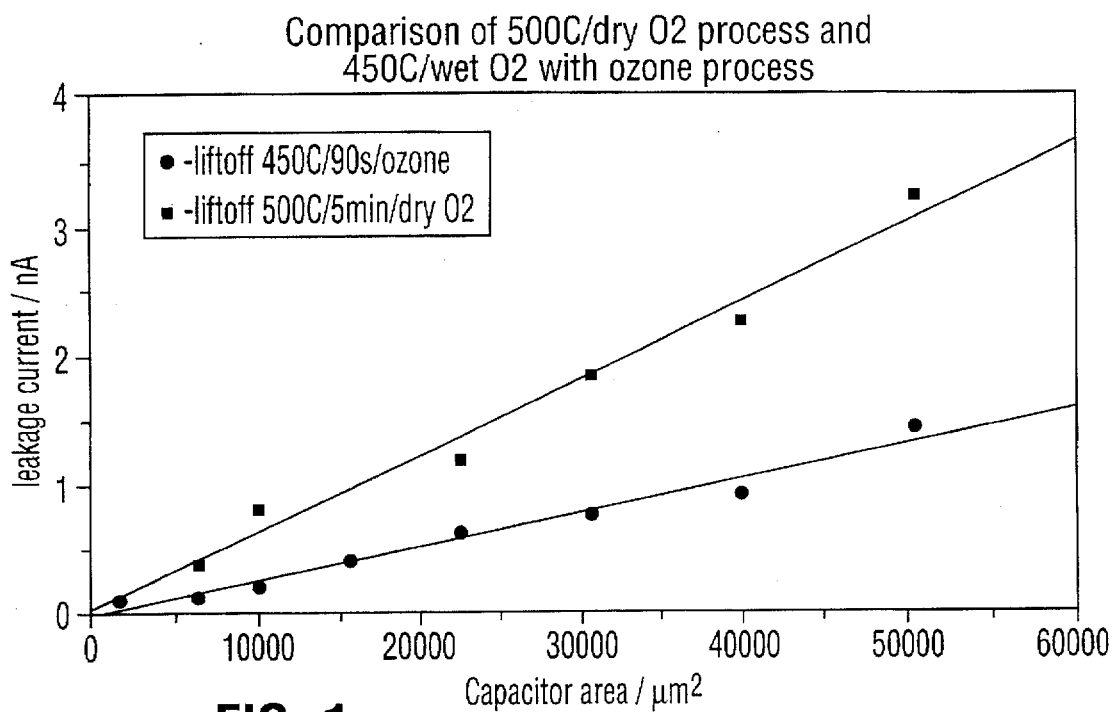
FIG. 1 shows a graph comparing the leakage current of capacitors, of different areas, fabricated by annealing in dry oxygen according to a conventional process and by annealing in oxygen/ozone and water vapour according to the method of the embodiment.
Figure 2:
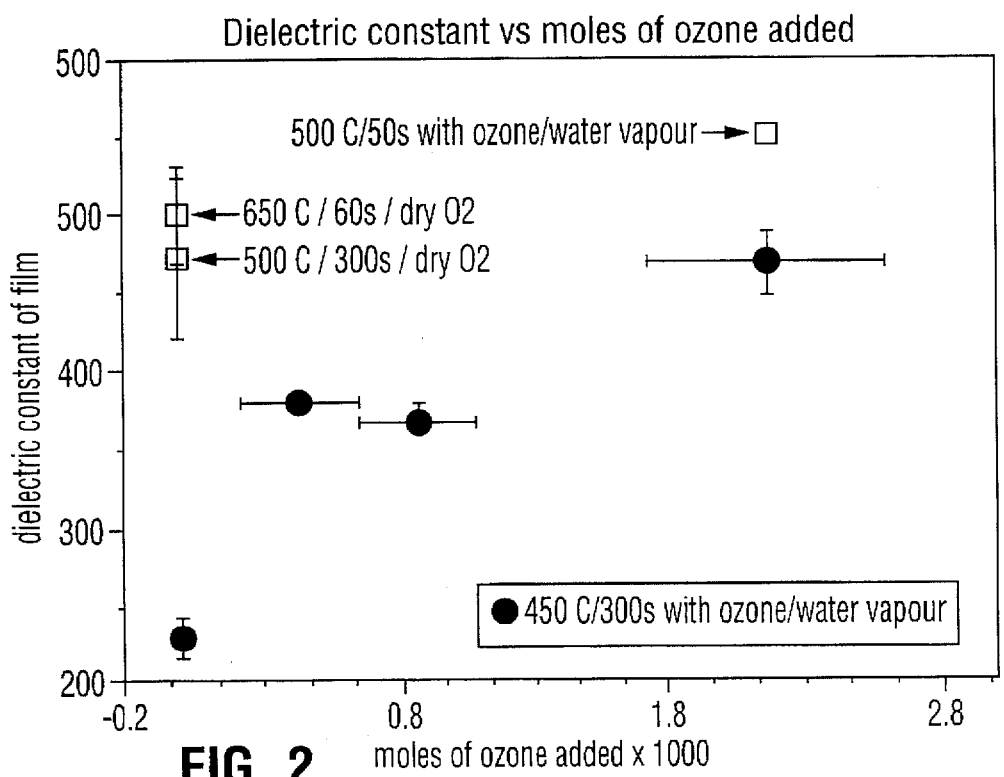
FIG. 2 shows a graph illustrating the dependence of the dielectric constant of PZT on the amount of ozone added to the annealing atmosphere for both wet and dry gas mixtures.
Figure 3:
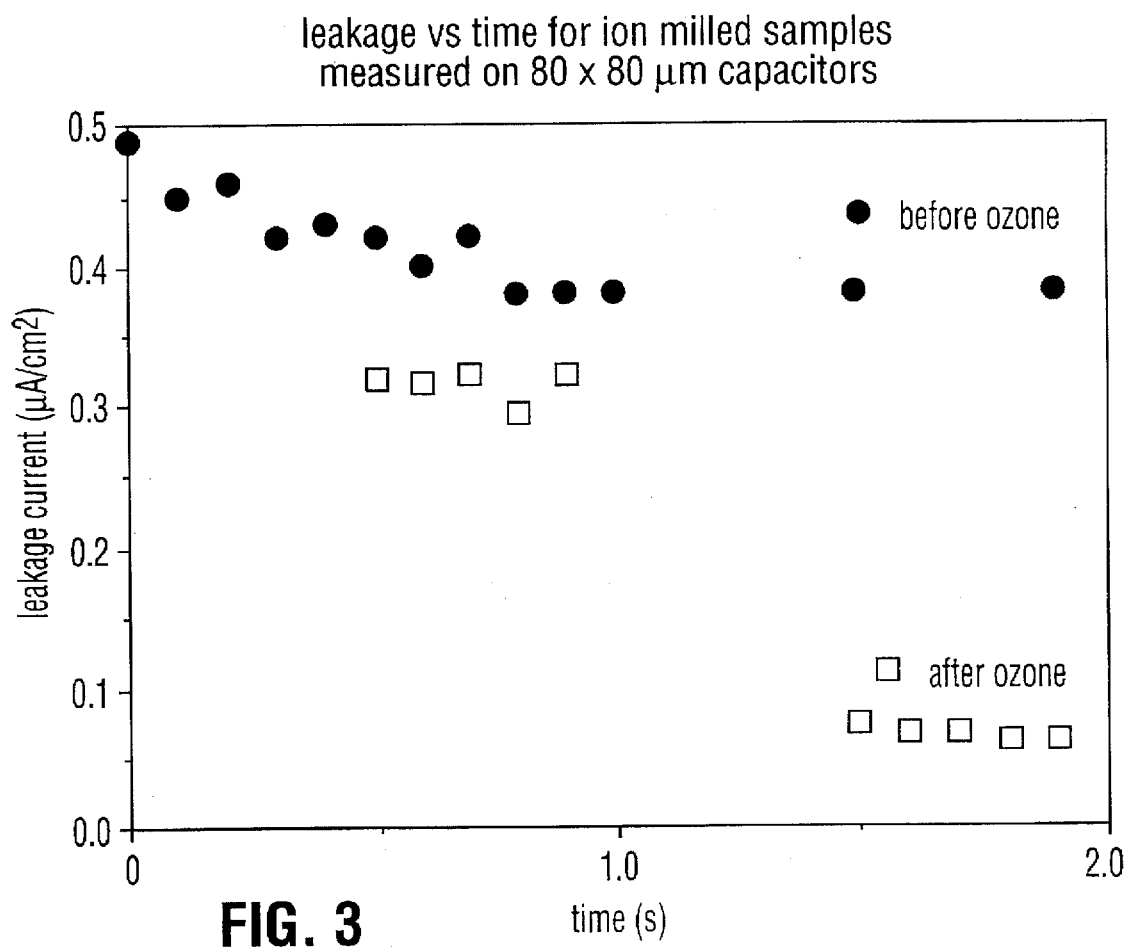
FIG. 3 shows a graph comparing the leakage current of ion milled ferroelectric dielectrics after a post-patterning anneal in oxygen with and without ozone.

In a method of forming a ferroelectric dielectric for a capacitor structure according to a first embodiment of the present invention, a ferroelectric capacitor structure was formed on an integrated circuit substrate comprising a semiconductor silicon wafer. A bottom electrode of a capacitor was defined on the substrate. The bottom electrode comprises a single conductive layer, or alternatively comprises a multilayer structure including a barrier layer and an adhesion layer. In the present example a Pt bottom electrode was used. A layer of lead zirconate titanate (PZT) was then formed on the bottom electrode, using a known spin-on liquid process to apply to the substrate a known metallorganic sol-gel precursor comprising constituents of the ferroelectric material, i.e. an inorganic lead compound, and zirconium and titanium alkoxides in the desired proportions. A layer of the required thickness was obtained by sequentially depositing and heat treating several thin layers. Each layer of as-deposited material was heat treated at low temperature, i.e. below ≦450° C. for about 90 seconds, to drive off volatile organic components and to form an amorphous layer. The resulting amorphous layer was then annealed by a rapid thermal annealing (RTA) process at 450° C. in an annealing atmosphere comprising oxygen in the presence of water vapour for 300 seconds. Water vapour was conveniently introduced into the annealing atmosphere of the rapid thermal anneal (RTA) system during the annealing of the PZT by passing oxygen ($O_2$) through a double bubbler containing purified deionized (DI) water, so that the oxygen was saturated with water vapour, e.g. using a gas flow rate of about 2 L/min. The effects of adding ozone to the annealing atmosphere were investigated. Data shown in FIGS. 1 to 3 compare results of measurements of characteristics including film stress, leakage current, dielectric constant, of ferroelectric capacitors structures fabricated according to the embodiment.

The effects of varying the composition of annealing atmosphere and the anneal temperature on film stress and leakage current were investigated. The presence of water vapour during annealing significantly reduced the film stress of the resulting ferroelectric layers relative to annealing in dry oxygen or dry ozone/oxygen mixtures. Addition of ozone speeded up oxidation and allowed reduced anneal times to achieve low temperature crystallization. The combined effect of oxygen/ozone in the presence of water vapour was found to reduce significantly the temperature and time required for crystallization to occur, i.e. from above 650° C. in dry oxygen only, to about 450° C. in the presence of water vapour and ozone/oxygen. X-Ray diffraction studies confirmed that crystallization to a perovskite phase occurred at 450° C. A residual peak of the pyrochlore phase was observed.

In the present work, the effect of the introduction of water vapor in the annealing ambient on the stress and crystallization kinetics was studied. The initial focus of this effort was a reduction of the crystallization temperature of the PZT from ~650° C. to <500° C. However, this led to the discovery that the presence of water vapour during annealing has a significant effect in reducing film stress. The introduction of water vapour by bubbling $O_2$ or an $O_2/O_3$ mixture through purified, de-ionized water into the rapid thermal anneal (RTA) system during the annealing of the PZT resulted in crystallization at about 450° C., with improved or comparable physical properties and electrical properties. In particular, annealing at low temperature 450°–500° C. in the presence of water vapour, as compared to the standard process in dry oxygen, resulted in a lower tensile stress ($2-3\times10^9$ dyne/cm$^2$) compared to the tensile stress values of $1-2\times10^{10}$ dyne/cm$^2$ that are seen in films annealed in dry oxygen ambient at ≧650° C. Generally, it is found to be advantageous if the film stress values be kept as low as possible in order to avoid the problems associated with the peeling of the films and adhesion to other materials.

The dielectric constant of the ferroelectric material increased with the amount of ozone in the annealing atmosphere. Ozone concentrations in the range 0.5 to 12% were investigated. It is believed that ozone concentrations in the range up to about 20% may be useful for annealing of ferroelectric dielectric materials. However, annealing in higher ozone concentrations may be impractical for semiconductor processing, in view of safety concerns regarding toxicity and potential fire hazard of ozone at higher concentrations (>30% ozone), and the requirement that any unreacted ozone is destroyed before exhausting the annealing chamber to atmosphere.

Thus, a rapid, low temperature method for the crystallization of ferroelectric materials such as PZT and doped PZT is provided. Rapid, lower temperature processing is particularly advantageous in allowing ferroelectric materials to be integrated into a process flow with a restricted thermal budget.

Pre-conditioning the substrate surface, i.e. by preparing the Pt electrode by a low temperature 400° C., 90 second, pre-anneal in oxygen, or oxygen and ozone, was beneficial in improving the electrical properties of the ferroelectric materials deposited thereon. This pre-anneal step improved the adhesion and uniformity of the coating of the precursor solution on the substrate. Alternatively, a wet oxidizing pre-treatment, e.g. a dip in a sulfuric acid/hydrogen peroxide cleaning solution was also found to improve the coverage of the precursor solution. When the pre-treatment was omitted, the dielectric constant of the ferroelectric material was reduced significantly. In U.S. Pat. No. 5,164,808, Evans et al. discuss an alternative pre-treatment for platinum electrodes using an oxygen plasma to form a thin surface oxide.

Crystallization at 450° C. enables the fabrication of ferroelectric capacitors to be done at a temperature compatible to those used in other low temperature IC fabrication steps. The improved crystallization method produces materials with electrical properties comparable with, or better than, the corresponding materials annealed at a temperature above 650° in a dry oxygen ambient.

Also, by using the lower temperature process, the bottom and top electrode of a ferroelectric capacitor may be provided by materials other than those which can withstand temperatures of ≧650° C. required for conventional ferroelectric deposition processes. Thus an electrode materials such as platinum may be replaced by other known conductive materials, or a ferroelectric capacitor may be fabricated after forming interconnect metallization, e.g. aluminum alloys, which would not otherwise be compatible with higher temperature processing. The reduction in the thermal budget provides for improved flexibility in the design layout. For example, ferroelectric capacitors can be placed over Al alloy interconnects, a step which therefore eliminates a major obstacle in integrating ferroelectric materials in integrated circuits.

At present, the phenomena leading to improved properties of the materials annealed at low temperature in the presence of water vapour, or water vapour and ozone is not fully understood. However, it is believed that the reduction of stress and crystallization temperature in the presence of water vapour may occur for the reasons discussed below.

Film stress was significantly reduced in all samples annealed in the presence of water vapour. Consequently it is believed that the reduction in crystallization temperature to obtain good quality ferroelectric dielectric films is a combined effect of annealing in the presence of both ozone and water vapour. While stress reduction appeared to be associated with the presence of water vapour during annealing, it is believed that the change in stress may be instrumental in promoting crystallization of the ferroelectric phase at lower temperature in the presence of ozone.

The crystallization of the as-deposited amorphous layers of deposited material into a ferroelectric perovskite phase involves a crystallographic transformation through certain intermediate phases (see above mentioned references to Merklein et al., Tuttle et al. and Wright et al). The nature of an intermediate phase is dependent on the initial film composition and stoichiometry. Generally, a non-ferroelectric cubic phase, referred to as the "pyrochlore" phase, has been identified as a prime intermediate compound. The metastable pyrochlore phase possesses a low dielectric constant and no remnant polarization, i.e. it is not ferroelectric. Typically, in known processes, transformation of the metastable pyrochlore phase into the required ferroelectric phase is achieved by annealing the film at temperatures in excess of 600° C., i.e. above the range of ~370° C. to 600° C. at which pyrochlore is typically observed to be stable. If an intermediate pyrochlore phase is formed, it maybe incompletely converted to the perovskite phase during subsequent higher temperature annealing. Although increasing the crystallization temperatures beyond 650° C. may eventually transform any remaining pyrochlore phase into perovskite phase, such ferroelectric films may contain a number of voids and defects.

Various factors influence the phase transformations. These factors may include the substrate material, composition and structure, film stoichiometry, stress, and the dynamic changes in these parameters during the annealing process. For example, typically, excess lead oxide is incorporated in the as-deposited films of precursor material for the ferroelectric material, to compensate for loss of lead by out-diffusion during the annealing process. If there is insufficient lead present in the system, the films only partially transform into the perovskite phase. Joshi et al., in an article entitled "Influence of the water of hydrolysis on microstructural development in sol-gel derived $LiNbO_3$ thin films", in J. Mater. Sci., Vol. 8, no. 10, October 93, discuss the influence of controlled additions of water to the sol-gel precursor for formation of crystalline $LiNbO_3$ thin films, and found addition of water to the solution, for hydrolysis, lowered the crystallization temperature. On the other hand, Merklein et al., found that extensive hydrolysis of the alkoxides in starting solutions for formation of PZT with higher amounts of water led to porous films, and found that lower water additions were essential for fabricating perovskite PZT films at lower temperatures, e.g. 525° C.

Other impurities may also distort the lattice parameters of the crystalline phases, and influence crystallization temperatures (see Wright et al., re substitution of Si). Similarly, the stress in the films can also influence the crystallization process. A change in the stress level during the annealing process (during the transformation process) may oppose the phase transformation, which would result in the stabilization of the metastable phase. On the other hand, the results presented above for annealing in the presence of water vapour, suggest that a reduction in tensile stress may be influential in favoring crystallization to the perovskite phase at a lower temperature.

The dielectric constant of PZT (40:60) films annealed by rapid thermal processing at 650° C. in dry oxygen was in the range from 500 to 550. Samples annealed in dry oxygen at 450° C. had dielectric constants ~200 to 225. Other samples annealed at between 450° C. in a mixture of oxygen/ozone and water vapour showed an increased in dielectric constant dependent on the amount of ozone in the annealing atmosphere (FIG. 2). A sample annealed at 450° C. in wet oxygen had a dielectric constant of 400. The sample annealed at 450° C. in wet oxygen and the highest concentration of ozone had a dielectric constant near to 500 comparable with samples dry annealed at higher temperatures. Increasing the anneal temperature to 500° C. using wet oxygen and the same amount of ozone increase the dielectric constant to 550.

The steady state leakage of a standard dry annealed PZT dielectric is about 60 nA/sq.cm, which is higher than the water vapor annealed PZT with 2 nA/sq.cm. The remnant polarization values are lower in case of water vapor annealed samples (90 $fC/\mu m^2$) compared to the standard process PZT (170 $fC/\mu m^2$). On the other hand, the fatigue characteristics of the remnant polarization are improved in water vapor annealed samples. In the dry annealed samples, the polarization decays to 30% of the initial value after $10^{11}$ cycles of fatigue, whereas the polarization of water vapor annealed samples decays only to 80% of the initial value.

In another set of PZT samples prepared under different conditions, the effect of annealing in wet and dry oxygen, with and without ozone were compared. A bottom electrode comprising 2000 Å platinum was deposited, followed by a blanket layer of 1800 Å PZT, and a top electrode comprising 1000 Å platinum patterned by a lift off technique. The PZT was deposited by two coatings, each of which were annealed for 90 seconds at 450° C., followed by a third coating and an final anneal at 450° C. for 5 minutes. Dielectric constants were measured as shown in Table I.

Thus annealing in wet oxygen improved the dielectric constant over annealing in dry oxygen. However annealing in wet oxygen with 1% ozone improved the dielectric constant to >300. The latter value is high enough for many applications. The samples annealed in dry oxygen with ozone had a significantly lower dielectric constant than other samples.

TABLE I

| anneal ambient | 80 μm × 80 μm capacitors | | 255 μm × 225 μm capacitors | |
|---|---|---|---|---|
| | dielectric constant | dissipation | dielectric constant | dissipation |
| dry oxygen | 225 ± 17 | 0.020 ± 0.005 | 219 ± 14 | 0.019 ± 0.001 |
| wet oxygen | 247 ± 5 | 0.021 ± 0.003 | 236 ± 2 | 0.019 ± 0.001 |
| dry 1% ozone in oxygen | 199 ± 18 | 0.022 ± 0.002 | 180 ± 6 | 0.023 ± 0.001 |
| wet 1% ozone in oxygen | 314 ± 7 | 0.014 ± 0.001 | 305 ± 3 | 0.016 ± 0.001 |

For comparison, ferroelectric capacitors structures were formed by deposition of a bottom electrode, a ferroelectric dielectric layer, and a top electrode and then patterned by 3 different methods: ion milling; chemically assisted reactive ion etch; and a lift-off technique. The latter process avoids exposure to ion bombardment and radiation damage. Leakage currents were 10 times higher for reactive ion etched samples relative to lift-off patterned samples, and ion milled samples had very high leakage currents, ~1000 times higher. Post-processing annealing in oxygen reduced leakage currents, from 5 to 10%; annealing in wet oxygen/ozone mixtures reduced the leakage currents by 70% for RIE samples, and by up to 95% for ion milled samples. The oxygen/ozone anneal also made more minor improvements to other properties of the ferroelectric material.

Thus, not only does the $O_2/O_3$ anneal in the presence of water vapour reduce the crystallization temperature to below 500° C., typically 450°–475° C. for PZT and PLZT, the stress and leakage current are reduced and fatigue behavior is improved.

In a method of forming a capacitor structure comprising a ferroelectric dielectric formed according to an embodiment of the invention, since the ferroelectric dielectric may be fabricated at a temperature below 500° C., the ferroelectric layer may be placed on top of the first level metallization, which may comprise a low melting point alloy, e.g. an aluminum alloy. For example, the capacitor may be formed between metal 1 and metal 2 of a multilevel metal interconnect scheme. Thus in providing an integrated circuit on a conventional semiconductor substrate i.e. a semiconductor silicon wafer, active device structures are fabricated on the substrate by a known method and may comprising e.g. bipolar and CMOS transistors, diodes, memory cells, etc. as is conventional in an integrated circuit. An overlying layer of isolation is formed thereon. After forming contacts to the underlying devices, a first level of metal interconnect material is deposited thereon, and patterned to define interconnections as required. A first intermetal dielectric layer, i.e. an oxide, is deposited over metal 1 to isolate metal 1 and form a planarized substrate for subsequent layers. A barrier layer is deposited overall. After opening vias through the barrier layer and the underlying dielectric layer for contacting the metal 1 interconnects, another conductive layer is deposited and patterned to define a bottom electrode of the capacitor. The conductive layer typically comprises a metal alloy but alternatively comprises a conductive metal oxide. A layer of ferroelectric capacitor dielectric is deposited on the bottom electrode by the method described above, using a low temperature process, and the ferroelectric layer is patterned. When patterning is by ion milling or reactive ion etching, a post patterning anneal in an oxygen/ozone containing atmosphere in the presence of water, as described above, is beneficial to the electrical properties of the ferroelectric dielectric layer. Another conductive layer is deposited thereon to form the top electrode. The structure is encapsulated in a capping layer, which functions as a diffusion barrier. Subsequent layers comprising dielectric and interconnect metallization are then completed in a conventional manner.

Another capacitor structure which benefits from a low temperature process for formation of a ferroelectric dielectric is discussed in detail in a copending U.S. Patent Application, to Emesh and Leung, filed concurrently herewith by the same assignee.

Thus, an improved process for ferroelectric crystallization at low temperature was obtained using low concentrations of ozone when annealing takes place in the presence of water vapour. This method is applicable to undoped and doped PZT, e.g. La or Nb doped PZT, or other perovskite ferroelectrics dielectrics.

Thus, although particular embodiments of the invention have been described in detail, it should be appreciated that variations, modifications and adaptations may be made without departing from the scope of the invention as defined in the claims.

What is claimed is:

1. A method of forming a crystalline perovskite ferroelectric dielectric material comprising:

depositing a layer of amorphous ferroelectric precursor material on an integrated circuit substrate, and then annealing the layer of amorphous ferroelectric precursor material at a temperature between 450° C. to 500° C. so as to cause a phase transformation to a ferroelectric crystalline perovskite phase, the annealing step comprising heating in an oxygen and ozone containing atmosphere in the presence of water vapor.

2. A method according to claim 1 wherein the oxygen and ozone containing atmosphere comprises an inert carrier gas.

3. A method according to claim 1 wherein the ferroelectric material comprises lead zirconate titanate.

4. A method according to claim 1 wherein the ferroelectric material comprises lead zirconate titanate and the anneal temperature is in the range 450° C. to 475° C.

5. A method according to claim 1 wherein the oxygen containing atmosphere comprises from 0.5% to 12% ozone in oxygen saturated with water vapour by bubbling the oxygen/ozone mixture through de-ionized water.

6. A method according to claim 1 wherein the ferroelectric precursor material comprises an amorphous layer formed by a metallorganic decomposition process comprising deposition and heating of a sol-gel mixture.

7. A method of forming an integrated circuit structure comprising a ferroelectric capacitor structure the method comprising:

providing a substrate and providing thereon a first capacitor electrode;

providing on the electrode a layer of crystalline perovskite ferroelectric capacitor dielectric material, by steps comprising:

depositing a layer of amorphous ferroelectric precursor material, and annealing the layer of amorphous ferroelectric precursor material at a temperature between 450° C. and 500° C. so as to cause a phase transformation to a ferroelectric crystalline perovskite phase, the annealing step comprising heating in an oxygen and ozone containing atmosphere in the presence of water vapor, and providing a second capacitor electrode thereon.

8. A method according to claim 7 wherein the steps of providing a layer of ferroelectric capacitor dielectric material comprises:

depositing said layer of ferroelectric capacitor dielectric overall;

patterning the dielectric by one of ion milling and reactive ion etching;

and, then annealing the patterned dielectric layer in an oxygen and ozone containing atmosphere in the presence of water vapour.

9. A method according to claim 7 wherein integrated circuit substrate comprises a low melting point metal or metal alloy.

10. A method according to claim 7 comprising preconditioning the first electrode by heating in an oxidizing ambient before providing thereon the ferroelectric capacitor dielectric material.

11. A method according to claim 10 wherein the oxidizing ambient comprises oxygen and ozone.

12. A method according to claim 7 wherein preconditioning the first electrode by immersing in a solution comprising hydrogen peroxide and sulfuric acid.

* * * * *